(12) United States Patent
Lee

(10) Patent No.: US 7,091,727 B2
(45) Date of Patent: Aug. 15, 2006

(54) METHOD AND IC FOR DETECTING CAPACITANCE VARIATION

(75) Inventor: Sang-Chuel Lee, Gyeonggi-do (KR)

(73) Assignee: AD Semiconductor Co., Ltd., Seoul (KR)

( * ) Notice: Subject to any disclaimer, the term of this patent is extended or adjusted under 35 U.S.C. 154(b) by 0 days.

(21) Appl. No.: 11/216,089

(22) Filed: Sep. 1, 2005

(65) Prior Publication Data
US 2006/0055417 A1    Mar. 16, 2006

(30) Foreign Application Priority Data
Sep. 2, 2004    (KR) ............... 10-2004-0070072
Nov. 23, 2004   (KR) ............... 10-2004-0096241

(51) Int. Cl.
*G01R 27/26*    (2006.01)
*G01R 31/08*    (2006.01)

(52) U.S. Cl. ............. 324/681; 324/520; 324/674

(58) Field of Classification Search ........... 324/681, 324/674, 520
See application file for complete search history.

(56) References Cited

U.S. PATENT DOCUMENTS

| | | | | |
|---|---|---|---|---|
| 3,694,742 A | * | 9/1972 | Bergmanis et al. | 324/663 |
| 3,805,149 A | * | 4/1974 | Delapierre | 324/681 |
| 4,794,320 A | * | 12/1988 | Chang | 324/678 |
| 5,136,262 A | * | 8/1992 | Spencer | 331/135 |
| 5,594,353 A | | 1/1997 | Hemphill | 324/681 |
| 6,194,903 B1 | | 2/2001 | Schulz | 324/661 |

FOREIGN PATENT DOCUMENTS

JP    A 09-089943    4/1997

* cited by examiner

*Primary Examiner*—Anjan Deb
*Assistant Examiner*—Amy He
(74) *Attorney, Agent, or Firm*—Oliff & Berridge, PLC

(57) ABSTRACT

A method and an integrated circuit for detecting capacitance variation includes the steps of: generating a detection frequency for capacitance variation and a detection frequency which lags the detection frequency by k times, wherein the detection frequencies are based on a time divisional format; operating the detection frequencies to produce a difference frequency; operating variation rate of the difference frequency; and comparing the variation rate of the difference frequency with a predetermined detection level, and outputting a signal indicative of capacitance variation if the variation rate of the difference frequency is greater than the detection level.

14 Claims, 8 Drawing Sheets

METHOD AND IC FOR DETECTING CAPACITANCE VARIATION

BACKGROUND OF THE INVENTION

1. Field of the Invention

The present invention relates to a method and an integrated circuit (IC) for detecting capacitance variation, and more particularly to a method and an IC that are capable of detecting capacitance variation using two time divisional frequencies, thereby enhancing sensitivity of detecting capacitance variation.

2. Description of the Related Art

A prior art integrated circuit of detecting capacitance variation is implemented to compare variation of detection frequency varied according to capacitance variation with a reference frequency and to output the detection frequency if the difference as the comparison result is over a predetermined value. Owing to time delay components of a charging/discharging control unit of a frequency generator generating a detection frequency, the detection frequency cannot be substantially generated in proportion to a capacitance variation. Therefore a lot of errors are produced when a relatively small capacitance variation is detected.

FIG. 1 is a circuit describing a prior art single frequency generator. Referring to FIG. 1, a target capacitor is installed in an input unit of an integrated circuit (IC) for detecting capacitance variation such that capacitance variation of the target capacitor can be detected. Before performing the detection, we assume that capacitance of the target capacitor is denoted as Cs, a constant current for charging/discharging the target capacitor is denoted as Is, parasitic capacitance generated in arrangement wires of the input unit is denoted as Cp, and td denotes time delay of the charging/discharging control unit, in which the time delay td includes switch delay components of a Schmitt trigger SCHMITT_A, an inverter INV_1A, PMOS transistors PM1~PM3 and NMOS transistors NM1~NM3. A time (period), Ta, means a time taken from when the target capacitor starts charging until its positive lead level reaches an input level of the Schmitt trigger SCHMIT_A, Vth (Vth=Vb−Va), and is expressed by the following equation.

$$1/fa = Ta = td + \frac{2Vth(Cs + Cp)}{Is} \quad (1)$$

In the case that the capacitance Cs of the target capacitor installed in the input unit is changed into capacitance Cs+Cx, a time (period), Ta', means a time taken from when the target capacitor starts charging until its positive lead level reaches Vth and is expressed by the following equation.

$$1/fa' = Ta' = td + \frac{2Vth(Cs + Cp + Cx)}{Is} \quad (2)$$

Therefore, the variation of the period is expressed by the following equation.

$$\frac{Ta' - Ta}{Ta} = \frac{Cx}{(Cs + Cp) + (Is/2Vth) \cdot td} \quad (3)$$

From the above equations, unless the time delay td of the charging/discharging control unit for capacitance variation Cx becomes sufficiently small, variation of a detection frequency fa for the capacitance variation Cx becomes small such that precision of its sensitivity can be decreased. Especially, if the detection frequency increases in order to prevent external noises, the prior art device can be largely affected by the components of the time delay td.

Therefore, the prior art IC has disadvantages in that, due to the time delay component of the charging/discharging control unit, variation of the detection frequency according to the capacitance variation is relatively small and thusly variation of small capacitance cannot be detected.

SUMMARY OF THE INVENTION

Therefore, the present invention has been made in view of the above problems, and it is an object of the present invention to provide a method for detecting capacitance variation capable of minimizing the effect of a time delay component of a charging/discharging control unit and enhancing measurement of capacitance variation, and an IC therefor.

In accordance with an aspect of the present invention, the above and other objects can be accomplished by the provision of a method for detecting capacitance variation which comprises the steps of: generating a detection frequency (fa) for capacitance variation and a detection frequency (fb) which lags the detection frequency (fa) by k times, wherein the detection frequencies (fa and fb) are based on a time divisional format; operating the detection frequencies (fa and fb) to produce a difference frequency (fd); operating variation rate of the difference frequency; and comparing the variation rate of the difference frequency with a predetermined detection level, and outputting a signal indicative of capacitance variation if the variation rate of the difference frequency is greater than the detection level.

Preferably the operating variation rate of the difference frequency may include the steps of: generating reference frequencies (fr(t)) expressed by the following equations, $fr(t)=fr(t-1)+m-n$, if $fd(t)-fd(t-1)>m$;

$fr(t)=fr(t-1)+g$, if $0 \leq fd(t)-fd(t-1) \leq m$; and $fr(t)=fr(t-1)+h$, if $fd(t)-fd(t-1)<0$, wherein, t and t−1 denote a current period and a previous period, respectively, $m \geq 1$, $0<n<m$, $g \geq 1$, $h \geq 1$, and $g>h$; and operating the variation rate of the difference frequency of $(fr(t)-fd(t))/fr(t)$.

In accordance with another aspect of the present invention, there is provided an integrated circuit (IC) for detecting capacitance variation which comprises: a dual frequency generation unit for generating a detection frequency (fa) for capacitance variation of a target capacitor and a detection frequency (fb) which lags the detection frequency (fa) by k times, wherein the detection frequencies (fa and fb) are based on a time divisional format; a difference frequency operation unit for operating the detection frequencies (fa and fb) to produce a difference frequency (fd); a difference frequency variation rate operation unit for operating variation rate of the difference frequency; a detection level input unit for inputting a predetermined detection level; a comparator for comparing the detection level inputted to the detection level input unit with the variation rate of the difference frequency; and an output unit for inverting its high level to low level if the variation rate of the difference frequency is greater than the detection level in the comparator, and outputting the low signal.

Preferably, the difference frequency variation rate unit may include: a reference frequency generation unit for generating reference frequencies (fr(t)) expressed by the following equations, $$fr(t)=fr(t-1)+m-n, \text{ if } fd(t)-fd(t-1)>m;$$

$$fr(t)=fr(t-1)+g, \text{ if } 0 \leq fd(t)-fd(t-1) \leq m; \text{ and}$$

$$fr(t)=fr(t-1)+h, \text{ if } fd(t)-fd(t-1)<0,$$

wherein, t and t−1 denote a current period and a previous period, respectively, m≧1, 0<n<m, g≧1, h≧1, and g>h; and an operation unit for operating the variation rate of the difference frequency of (fr(t)−fd(t))/fr(t).

Preferably, the integrated circuit (IC) may further comprise: a reference frequency holding unit for holding a reference frequency (fr(t)) depending on time, which is generated in the reference generation unit.

Preferably, the reference frequency holding unit may include a resistor such that a holding time of the reference frequency (fr(t)) is determined according to resistance of the resistor.

Preferably, the output unit may include an integrator for integrating the comparison result outputted form the comparator.

Preferably, the detection level input unit may include a single external pin to which an internal reference clock, a current source and an external capacitor (Cd), such that the external capacitor (Cd) can be charged by the current source;

wherein the detection level input unit measures time when a voltage of the external capacitor (Cd) reaches the predetermined reference voltage (Vth) and selects a detection level according to codes determined therein based on the measured time, thereby inputting a plurality of detection levels through the single pin.

Preferably, the integrated circuit (IC) may further comprise:

a dual frequency modulation (DFM) unit enabling the dual frequency generation unit to increase occurrence period of the detection frequency (fa) during a predetermined time at a time point when the variation rate of the difference frequency is greater or less than the detection level.

Preferably, the integrated circuit (IC) may further comprise: an enable signal input/output unit configured to be in an enable state if inputting a high voltage from the outside and to be in a standby state if inputting a low voltage, wherein the enable signal input/output unit itself generates a low signal not to input the low signal from the outside and outputs the low signal to the outside so as to communicate with adjacent elements during the operation of the DFM.

Preferably, the dual frequency generation unit is numerously configured to generate detection frequencies (fa and fb) for a plurality of target capacitors, and wherein the enable signal input/output unit, the number of which is identical to that of the dual frequency generation unit, is installed thereto.

Preferably, the target capacitor is in series or in parallel connected to a sensitivity adjusting capacitor, and to the dual frequency generation unit together.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

While the invention has been shown and described with respect to the preferred embodiments, it will be understood by those skilled in the art have various changes and modifications may be made without departing from the spirit. Thus, the scope of the invention should not be limited by the embodiments of the present invention.

[First Embodiment]

Figure 1:
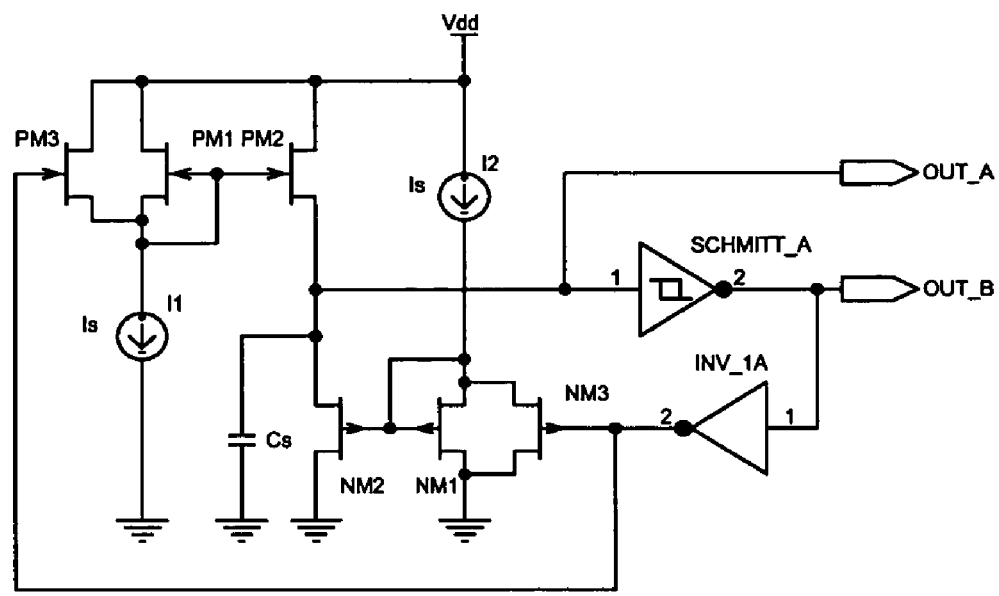
FIG. 1 is a circuit describing a prior art single frequency generator.
Figure 1:
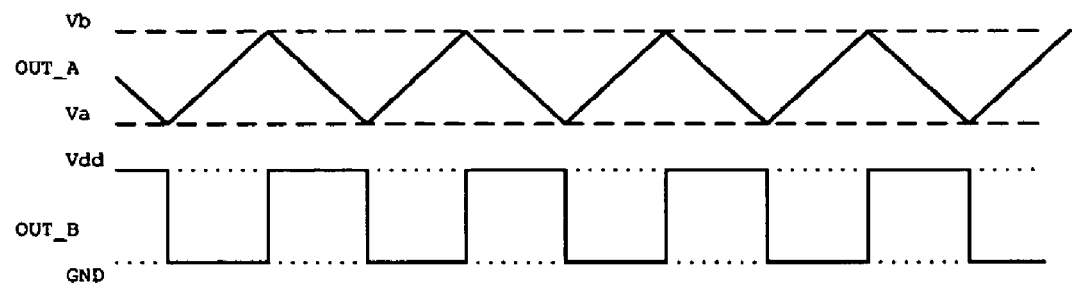
Figure 2:
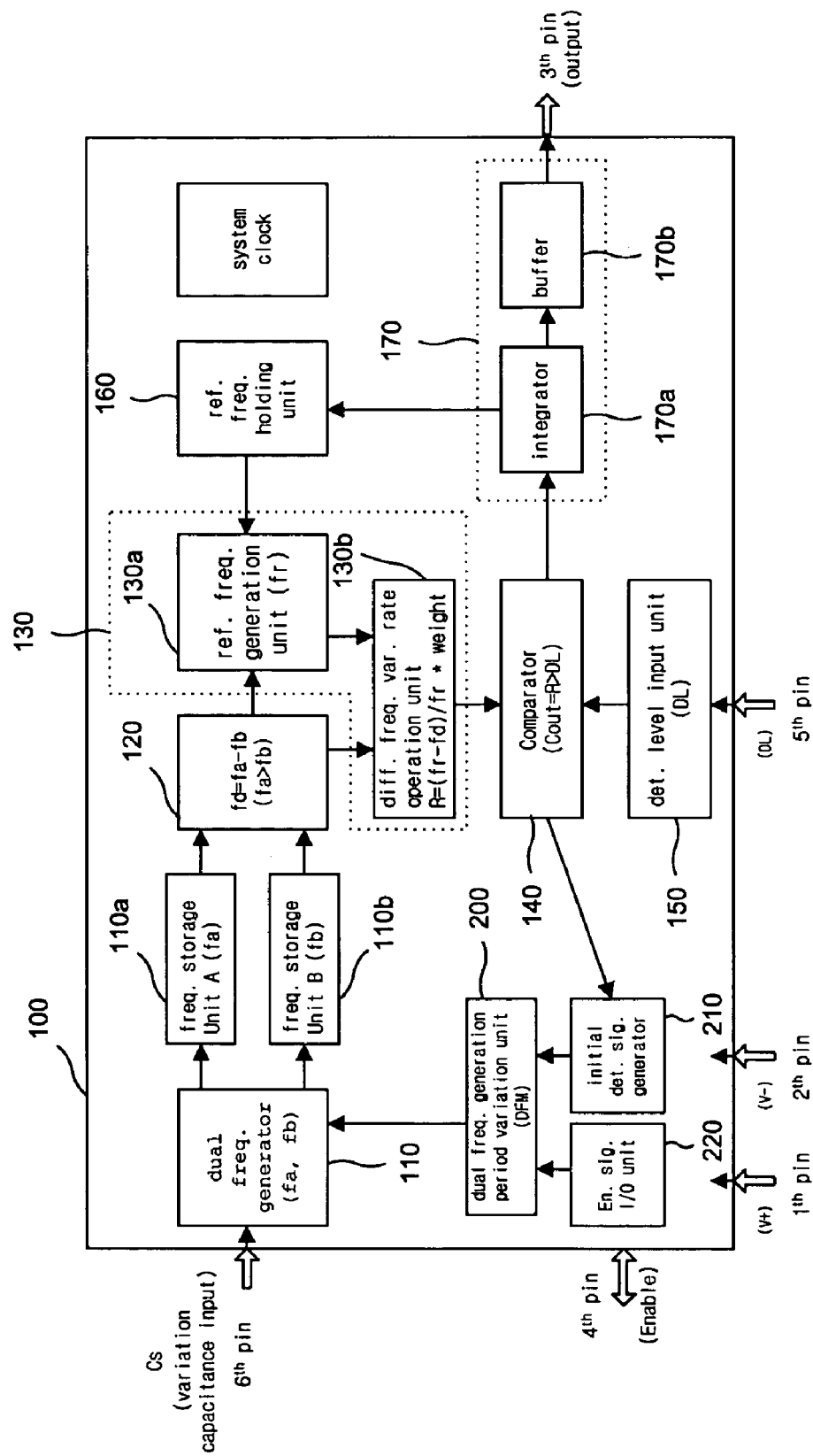
FIG. 2 is a schematic block diagram describing an IC for detecting capacitance variation according to a first embodiment of the present invention.

FIG. 2 is a schematic block diagram describing an integrated circuit (IC) 100 for detecting capacitance variation according to a first embodiment of the present invention, in which the IC is implemented with a chip having six pins. Referring to FIG. 2, the method for detecting capacitance variation according to the present invention will be described in detail. The first pin of the chip serves as an input lead for inputting a voltage V+. The second pin serves as an input lead for inputting a voltage V−. The third pin serves as an output lead. The fourth pin serves as an input/output lead for inputting/outputting an enable signal. The fifth pin serves as an input lead for inputting a detection level. The sixth pin serves as an input lead to which capacitance Cs is applied.

[Dual Frequency Generation]

When capacitance Cs of a target capacitor is applied to a dual frequency generator 110 via the 6$^{th}$ pin, the dual frequency generator 110 generates detection frequencies fa and fb, in a time divisional format, for capacitance variation. Here, fa leads fb by a current rate k of current flowing into the target capacitor.

Figure 3:
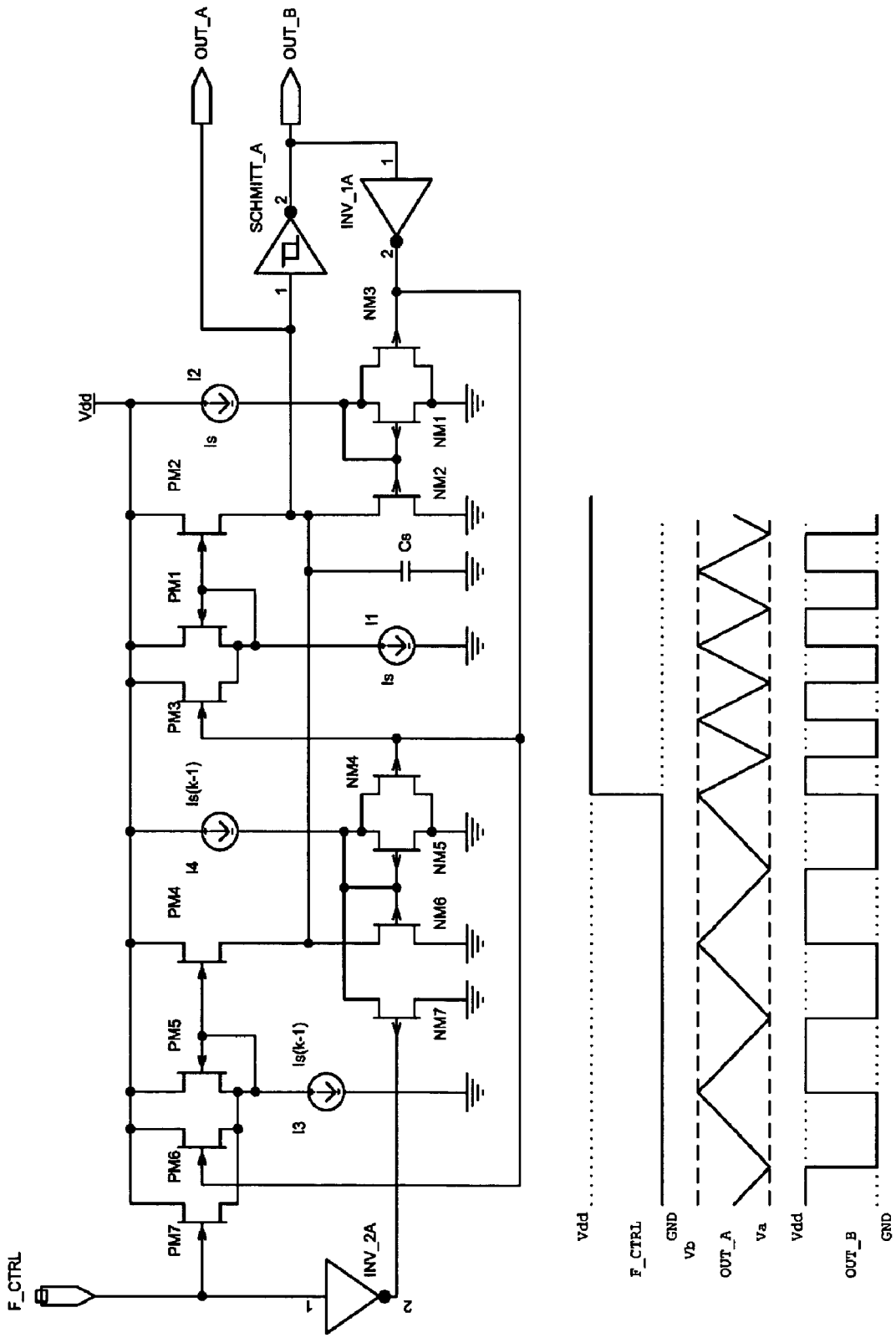
FIG. 3 is a circuit diagram of a dual frequency generator 110 of the IC of FIG. 2 and waveforms describing its operation.

FIG. 3 is a circuit diagram of a dual frequency generator 110 of the IC of FIG. 2 and waveforms describing its operation. When F_CTRL is a low voltage signal GND, the PMOS transistor PM7 and the NMOS transistor NM7 are active such that they exceedingly provide currents I3 and I4 to respective current sources. Therefore, a PMOS transistor PM4 for charging the target capacitor and an NMOS transistor NM6 for discharging it are disabled, respectively.

Under such a state, since the target capacitor having a capacitance Cs charges via a PMOS transistor PM2 and discharges via an NMOS transistor NM2, current Is for charging and discharging is applied thereto. When a voltage of the capacitor having capacitance Cs, which is charged by inputting constant current Is via the PMOS transistor PM2, reaches an upper limit voltage Vb of the Schmitt trigger SCHMITT_A, the Schmitt trigger SCHMITT_A changes its output from LOW to HIGH and the inverter INV_1A changes its output from HIGH to LOW. Therefore, the NMOS transistor NM3 is disabled and the PMOS transistor PM3 is enabled such that the PMOS transistor PM2 is disable and the NMOS transistor NM2 is enabled, thereby flowing the constant current Is through the NM2 so as to discharge the capacitor. On the other hand, if the voltage of the target capacitor reaches a voltage Va, the voltage of the Schmitt trigger SCHMITT_A is low, the PMOS transistor PM3 is disabled and the NMOS transistor NM3 is enabled such that the target capacitor starts recharging via the PMOS transistor PM2. Here, a series of processes as above-mentioned are repeatedly preformed to generate output waveforms OUT_B with a frequency fb.

On the other hand, when F_CTRL is a high voltage signal, the operations of the PM6 and NM4 are the same as those of the PM3 and NM3 such that the target capacitor charges via the PM2 and PM4 and discharges through the NM2 and the NM6. Here, the respective charging and discharging currents are K·Is, respectively, with a frequency fa which leads a frequency fb by K. The frequencies fa and fb are expressed by the following equations.

$$1/fa = Ta = \frac{2Vth(Cs + Cp)}{k \cdot Is} + td \qquad (4)$$

$$1/fb = Tb = \frac{2Vth(Cs + Cp)}{Is} + td \qquad (5)$$

Here, Cs denotes capacitance of a target capacitor, Is denotes constant current when performing charging/discharging operations in a dual frequency generator 110, Cp denotes parasitic capacitance of a dual frequency generator 110, td denotes time delay of a charging/discharging control unit, and Vth (=Vb−Va) is a trigger voltage level of a Schmitt trigger SCHMITT_A.

In the case that capacitance Cs applied to the $6^{th}$ pin is changed into capacitance Cs+Cx, the detection frequency fa' and fb' are expressed by the following equations.

$$1/fa' = Ta' = \frac{2Vth(Cs + Cp + Cx)}{k \cdot Is} + td \qquad (6)$$

$$1/fb' = Tb' = \frac{2Vth(Cs + Cp + Cx)}{Is} + td \qquad (7)$$

Therefore, frequency variation is expressed by the following equation.

$$\frac{dT' - dT}{dT} = \frac{Cx}{(Cs + Cp)} \qquad (8)$$

Namely, although the component of the time delay td of the charging/discharging control unit affects a frequency variation rate if a single oscillation frequency for the capacitance is employed, the two frequency components are applied thereto in a time divisional format to obtain a difference frequency. After that, based on the difference frequency, variation rate of the difference frequency can be obtained. From the result, since capacitance variation is approximately proportional to the variation rate of the difference frequency, if weight of the parasitic capacitance Cp is reduced, capacitance variation is more proportional thereto.

[Effect of Time Delay td]

Figure 4:
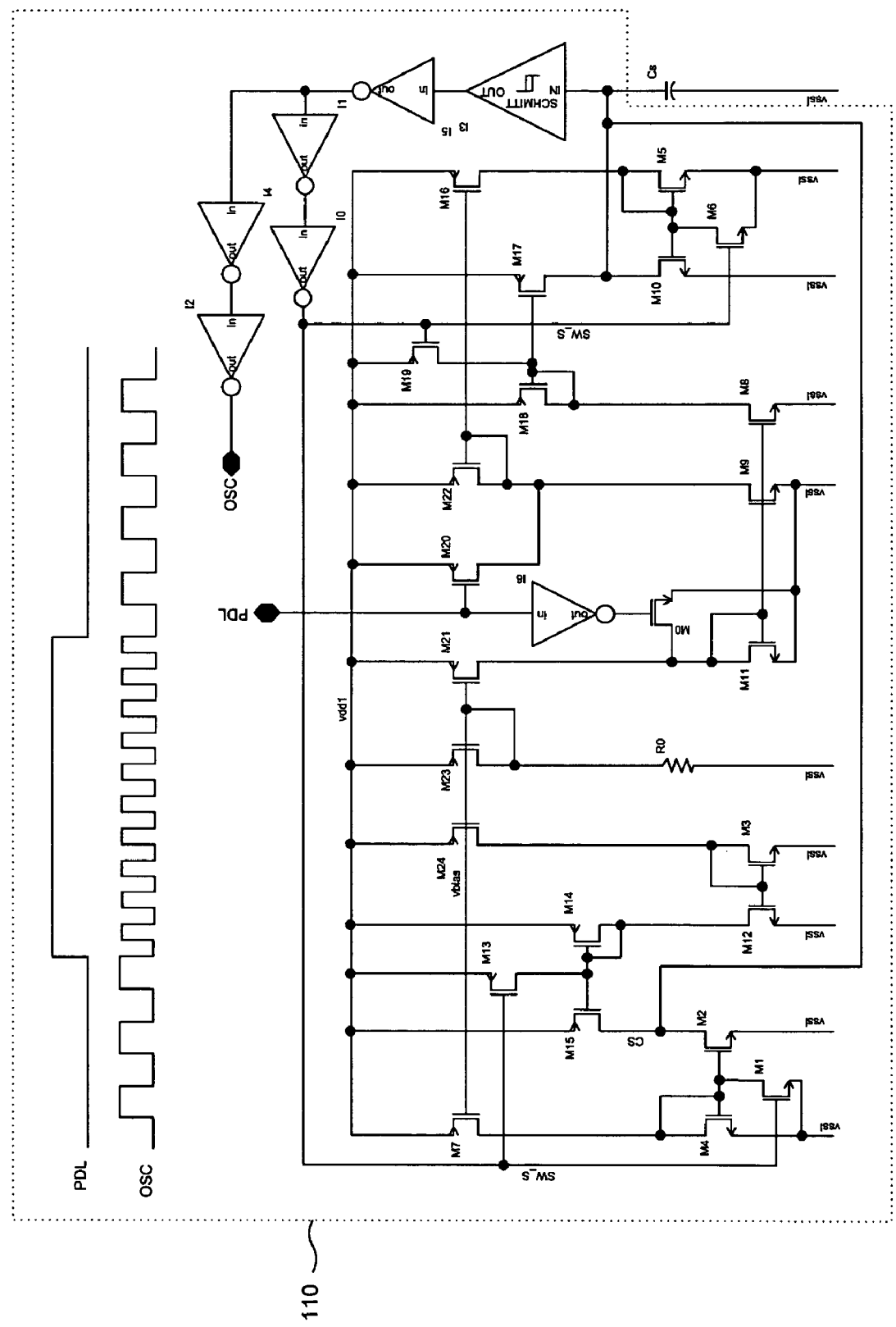
FIG. 4 is a detailed circuit diagram of a dual frequency generator 110 of the IC of FIG. 2 and waveforms describing its operation.

FIG. 4 is a detailed circuit diagram of a dual frequency generator 110 of the IC of FIG. 2 and waveforms describing its operation. Referring to FIG. 4, effect by the time delay td is described in detail below.

When PDL is low, transistors M17 and M10 are disabled and thusly a path for charging/discharging a target capacitor is also disabled. The target capacitor is then charged/discharged through the transistors M15 and M2. In such a case, the charging/discharging current decreases and thusly the oscillation frequency is reduced as shown in the waveform of FIG. 4.

On the other hand, when PDL is high, charging/discharging currents are simultaneously added thereto by the transistors M17, M10, M15 and M2 together such that a total charging/discharging current is increased. Therefore, oscillation frequency of an oscillator OSC is increased.

The oscillation period T of the oscillator OSC is expressed by the following equation.

$$T = \frac{2Vth(Cs + Cp)}{k \cdot Is} + td \qquad (9)$$

The oscillation frequency is determined by capacitance Cs of a target capacitor installed at the outside of the IC, parasitic capacitance Cp, time delay td of a charging/discharging control unit, charging/discharging current Is flowing through a resistor RO, and a reference voltage Vth of a Schmitt trigger SCHMITT.

The time delay td of the charging/discharging control unit includes switch delay components generated by inverters I0, I1 and I5 in an inverter loop of the oscillator OSC, and switch delay components generated by the MOS transistors M19, M17, M6, M10, M13, M1, and M2.

Figure 5:
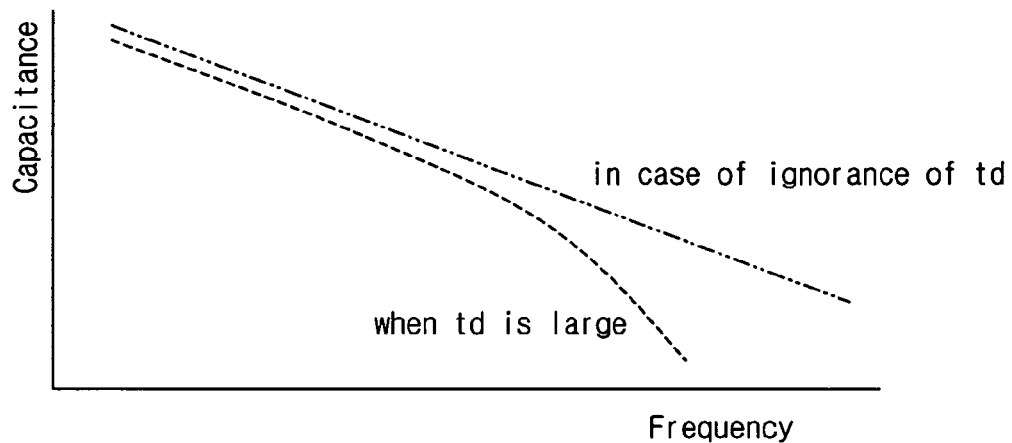
FIG. 5 is a view showing graphs describing the effect of a time delay component td of a charging/recharging control unit of FIG. 2.

When a voltage charged by capacitance Cs+Cp is greater than the reference voltage Vth of the Schmitt trigger SCHMITT, the charging (discharging) path should have been disabled and switched into a discharging (charging) path, immediately after the Schmitt trigger SCHMITT inverts its output. But, due to the presence of a component of time delay td of the charging/discharging control unit, the charging/discharging path is changed at a time delayed by the delay time td from the time point when the Schmitt trigger SCHMITT inverts its output. Therefore, if the oscillation frequency is increased, the frequency variation for the capacitance due to the component of time delay td is deviated from the proportional relation, as shown in FIG. 5.

Referring to FIG. 2, to avoid such an effect as mentioned above from the time delay td of the charging/discharging control unit, the present invention employs dual frequencies fa and fb in a time divisional format. The dual frequencies fa and fb are generated by a dual frequency generation unit 110 and stored in frequency storage units 110a and 110b such that they are operated to generate a difference frequency fd (=fa−fb) by a difference frequency operation unit 120. The difference frequency is used to generate a difference frequency variation rate R in a difference frequency variation rate operation unit 130.

[Reference Frequency Generation]

Operations of the difference frequency variation rate R are described in detail below. Firstly, a reference frequency fr is generated through a reference frequency generation unit 130a. Since the reference frequency fr is compared with a detection frequency and used for capacitance variation, it is important to properly generate the reference frequency fr such that external noise can be discriminated therefrom and signals can also be outputted therefrom.

The reference frequency fr is expressed below according to the given conditions:

$$fr(t)=fr(t-1)+m-n, \text{ if } fd(t)-fd(t-1)>m;$$

$$fr(t)=fr(t-1)+g, \text{ if } 0 \leq fd(t)-fd(t-1) \leq m; \text{ and}$$

$$fr(t)=fr(t-1)+h, \text{ if } fd(t)-fd(t-1)<0.$$

Figure 6:
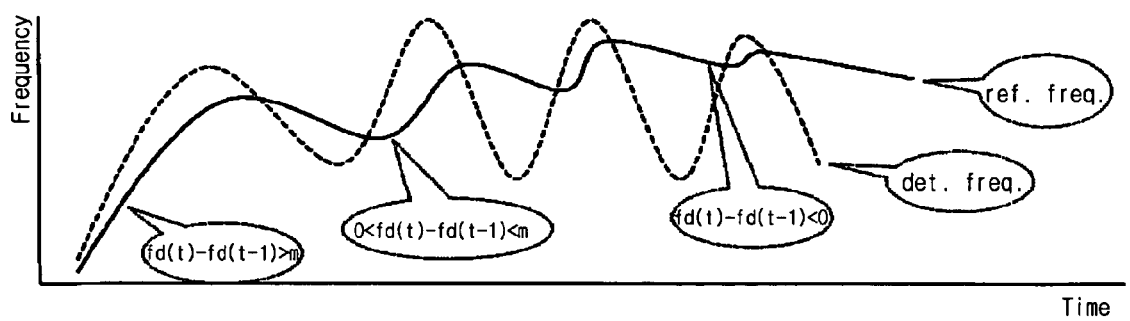
FIG. 6 is a view showing graphs describing relationship between a reference frequency fr and a detection frequency fd.

According to these equations, the relationship between the reference frequency fr and a detection frequency fd is illustrated as shown in FIG. 6. Here, $m \geq 1$, $0<n<m$, $g \geq 1$, $h \geq 1$, and $g>h$.

Referring to FIG. 6, if the detection frequency is rapidly increased (more than m), the reference frequency fr rapidly increases at a speed similar to the increasing speed of the detection frequency. Therefore, since the reference frequency fr follows a detection frequency within a short time, immediately reflecting rapid change of the detection frequency thereto, a stable state is rapidly achieved and capacitance variation can also be detected immediately after applying power thereto.

Although the detection frequency is decreased since capacitance increases based on a condition of g>h, the reference frequency fr is slowly decreased such that the capacitance variation can be detected.

Here, g is preferably set to a relatively large value such that the capacitance of the target capacitor can be rapidly restored when it increases and then decreases to make the capacitor stable. Such a setting serves to immediately detect a state wherein a detection frequency lags a reference frequency since capacitance of the target capacitor is instantaneously increased.

[Difference Frequency Variation Rate]

When a reference frequency fr is generated through the reference frequency generation unit 130a, the difference frequency variation rate R (=(fr−fd)/fr) is operated in the operation unit 130b. The difference frequency variation rate R may be calculated by multiplying (fr−fd)/fr by a proper weight.

[Output]

The comparator 140 compares a detection level DL inputted into a detection level input unit 150 with the frequency variation rate R and then outputs the result to the output unit 170. If the difference frequency variation rate R is greater than the detection level DL, the output unit 170 changes its output signal from HIGH to LOW and then outputs LOW signal through the $3^{rd}$ pin. Preferably, the output unit 170 includes an integrator 170a for integrating the result of the comparator 140 so as to prevent noises for a predetermined time and a buffer 170b for storing the integration result.

[Detection Level Input]

Figure 8:
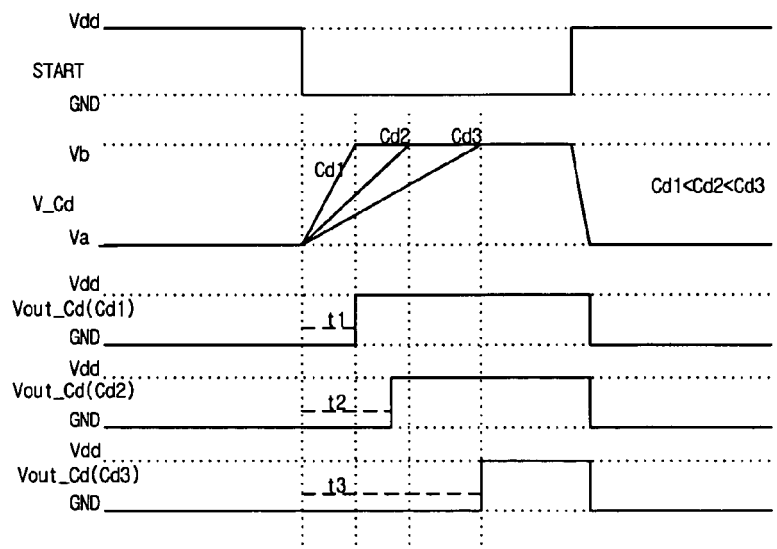
FIG. 8 is a view showing waveforms of a detection level input.
Figure 9:
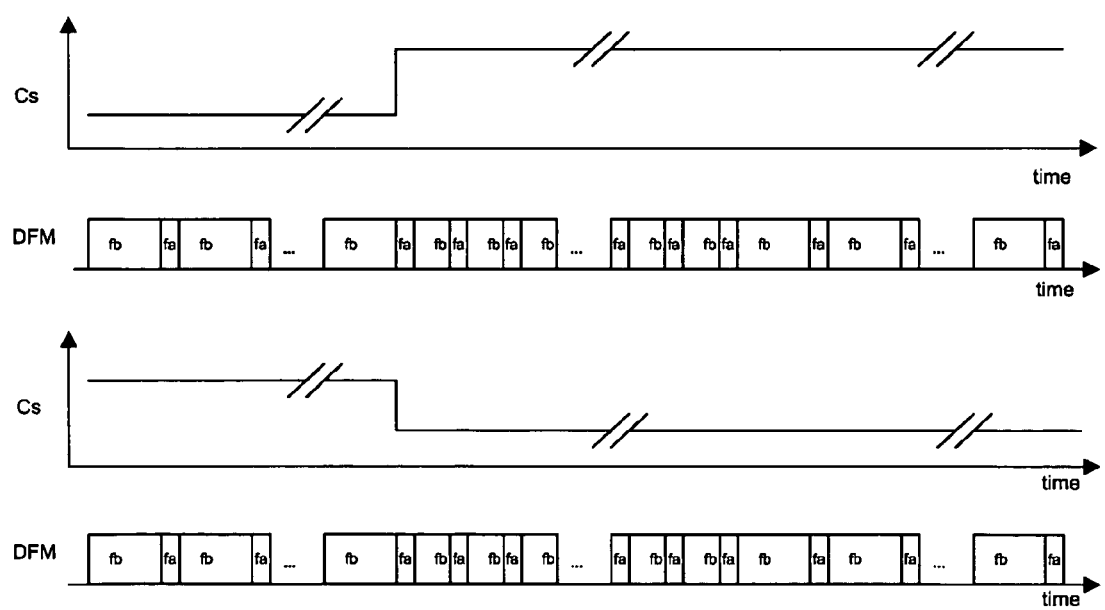
FIG. 9 is a view describing operation of a DFM unit 200.

An external capacitor Cd is connected to the $5^{th}$ pin such that it can be charged by current supplied from the $5^{th}$ pin with a predetermined level. Here, under a condition that current intensity of current outputting from the $5^{th}$ pin is constant, if a plurality of capacitors, for example, Cd1, Cd2 and Cd3, are connected to one by one, each of the external capacitors is charged to a predetermined reference voltage Vth differing its charging time according to respective capacitances of the plurality of capacitors, as shown in FIG. 8. Therefore, based on measurements of such charging times, detection levels are selected according to codes determined in the chip.

The external capacitor Cd is charged using a current I1 of a current source identical to a current I3 of another current source employed in the system clock generation unit, based on a reference clock generated in a system clock generation unit. At the same time, a counter measures time when a charging value of the external capacitor Cd reaches the input limit Vb of the Schmitt trigger SCHIMTT_A. Here, when an ENABLE (RST) input signal inputted to an input lead of the counter is low, the counter counts the number of system clock SYSTEM CLOCK inputted to a clock lead of the counter and outputs the counted number as a digital value through an output lead.

The ENABLE (RST) input signal is generated by performing an OR operation upon a START signal and voltage Vout_Cd. If the result of a logic OR operation is low, the counter is actived. If the result is high, the counter is disabled. On the other hand, if the START signal is low, the external capacitor having capacitance Cd starts to charge therein. At the same time, Vout_Cd charges its state from LOW to HIGH when V_CD reaches Vb. During such a time, the counter outputs the counted number. On the other hand, if the START signal is high, the external capacitor Cd discharges and awaits a next period. The low duration of Vout_Cd is relatively increased when the capacitance Cd of the external capacitor connected to the outside is relatively large.

Figure 7:
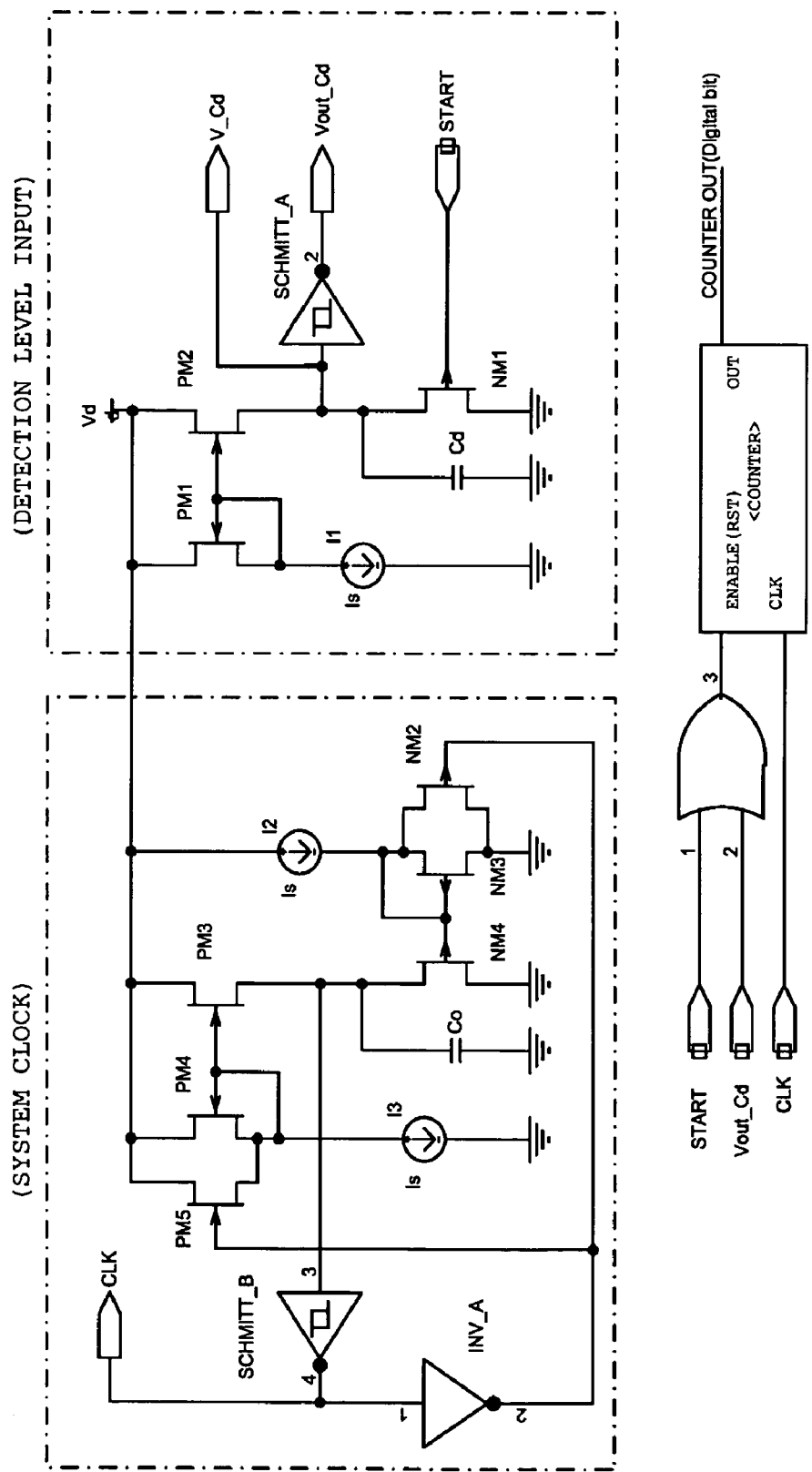
FIG. 7 is a block diagram illustrating a detection level.

While a START clock is LOW as shown in FIG. 8, a time for selecting a detection level is measured through a counter of FIG. 7. While the START clock is HIGH, the counter awaits a next low period in a reset state. Under such circumstances, since the detection level can be periodically selected, it is possible to increase/decrease the detection level for a specific period, respectively. Also, a plurality of detection levels can be inputted using only a single external pin. Of course, when replacing the external capacitor having capacitance Cd with a new one, the same reference clock and current source are preferably employed therein. Here, variation of current source generated in the IC fabricating process can be reduced as the current source outputting current I1 for charging the external capacitor Cd as shown in FIG. 7 is configured to be identical to the current sources outputting currents I2 and I3 of the system clock unit.

Sensitivity may be changed according to capacitance Cd of the external capacitor, and also by adjusting capacitance Cs of the target capacitor. The detection IC according to the present invention is implemented to detect variation of capacitance Cs of the target capacitor in the chip and to generate an output if the variation rate of the capacitance Cs is greater than a variation rate corresponding to the capacitance Cd of the external capacitor.

Here, the greater is the capacitance Cs, the lower is the variation rate of capacitance Cs, ΔCs/Cs. Therefore, although the capacitance Cd of the external capacitor is not changed, if a capacitor for adjusting sensitivity is connected in series or in parallel between the $4^{th}$ and $6^{th}$ pin to the target capacitor, the capacitance applied to the $6^{th}$ pin is substantially changed and the sensitivity is also changed.

[Reference Frequency Holding]

When capacitance Cs of the target capacitor increases, the difference frequency fd is decreased. If the variation rate (decreasing rate) of the difference frequency is greater than the detection level, the output unit outputs a low voltage signal. As the difference frequency fd decreases it becomes nearly equal to the reference frequency for an instant that the difference frequency fd is similar to the reference frequency. At that moment, since the variation rate of the difference frequency fd is less than the detection level, the variation of the capacitance may not be detected.

A reference frequency holding unit 160 has a function to hold a change according to time of the reference frequency fr(t) generated in the reference frequency generation unit 130. The reference frequency holding unit 160 is implemented to include a resistor having a predetermined resistance, which is installed therein, such that constant current is generated by the resistance in the system clock generation unit, and constant currents I2 and I3 are generated as shown in FIG. 7. Here, the resistor is variable. When the resistance is relatively large, the internal clock speed is slow, and the reference frequency holding time is increased. In that case, slow capacitance variation can be detected. On the other hand, when the resistance is relatively small, since the reference frequency can rapidly follow capacitance variation relatively rapidly varied, a state wherein the irregularly changed capacitance variation can be overcome under noises.

[Dual Frequency Modulation (DFM)]

The present invention includes a Dual Frequency Modulation (DFM) unit 200 for adjusting an occurrence period of a frequency fa to reduce power consumption. Since a CMOS transistor consumes power proportional to its operation frequency seed, it needs to reduce occurrence period of the frequency fa having a relatively large oscillation frequency, thereby reducing power consumption.

For this, a comparator 140 starts to recognize the detection signal, the occurrence frequency of fa is increased such that it can be integrated by the integrator 170a. After that an output is generated based on the integration result. However, since the detection signal is often mixed with noise, unless the detection signal is successively recognized, an initially recognized detection signal is erroneously determined to be a noise component. Therefore, the occurrence frequency of fa is decreased, again. Here, the time when recognizing the detection signal means a beginning time point when the comparator 140 outputs a result if the variation rate R is greater than the detection level, and also it is a time point that capacitance Cs of the target capacitor is normally increased if there is no noise.

In the case that the detection signal is recognized, occurrence frequency of fa is increased, the detection signal is integrated, the integrated signal is determined, and a final output is generated, since it is in a stable state, occurrence frequency of fa is decreased to reduce power consumption (a portion that capacitance Cs is increased and then the increased capacitance Cs is maintained at a predetermined value). Namely, occurrence frequency of fa is decreased in a detection state and in a non-detection state, with respect to a time point when an initial detection signal is generated (a time point when Cs increases) and a time point when the initial detection release signal is generated (a time point when Cs decreases), occurrence frequency of fa is increased during a predetermined time. Therefore, delay of circuit operation in the entire system is prevented, occurrence frequency of fa is varied to reduce power consumption, and fb having a relatively small frequency is oscillated during the remaining period. In order to further reduce power consumption, the frequency of fb may be set to zero. The generation of the initial detection signal and the initial detection release signal is detected in the initial detection signal generation unit 210.

Period of frequency fa consuming relatively much power is intensively generated at a time when capacitance variation is varied and reduced at an interval when the capacitance variation is not varied, thereby reducing power consumed by circuit operation.

[Enable Signal Input/Output Unit]

An enable signal input/output unit 220 serves to classify a circuit operation mode and a standby mode and to reduce operation current in the standby mode, considering current consumption in the case of using a battery, etc. Namely, in the standby mode, the DFM unit 200 halts generation of fa and fb to limit current consumption as much as possible.

The enable signal input/output unit 220 recognizes an enable state if a voltage applied from the outside via the $4^{th}$ pin is high and a standby state if the voltage is low.

When a low signal is inputted in the DFM unit 200 through the $4^{th}$ pin while it stores frequencies in internal memories 110a and 110b, an operation error may occur therein. Therefore, in order that a low signal cannot be inputted into the DFM unit 200 while it stores frequencies in the internal memories 110a and 110b, it itself generates a low signal and outputs the low signal to the outside through the $4^{th}$ pin such that it can communicate with another chip.

Therefore, when a plurality of chips are simultaneously used, if enable signal input/output units 220 are connected to one and another, a chip A operates to generate a frequency fa and then stores the frequency fa in a memory. When storing the frequency fa in the memory, the enable signal input/output unit 220 of chip A outputs a low signal to other chips electrically connected thereto. Namely, while the low signal is transmitted from the chip A to other chips, other chips hold their operations to await next operations. After terminating the operation of the chip A, the enable signal input/output unit 220 of the chip A outputs a high signal. Therefore, the DMF units operate in order based on a sequence wherein other chips are close at a time point when generating fa.

Therefore, fa cannot be simultaneously generated among chips. Especially, interference among chips can be reduced when severe noise is present. When a signal having a predetermined high interval is applied to the enable signal input/output unit through the $4^{th}$ pin by an external microcomputer, etc., the chip operates only at the high interval. Therefore, since the chip is operated only during a desired period, current consumption can be optimized.

Although the embodiment of the present invention as mentioned above has described the a case wherein a single channel IC having a dual frequency generation unit 110 in a chip, the present invention can be implemented to include the case where a multi-channel IC having a plurality of dual frequency generation units 10 in a single chip. As to the multi-channel IC, it can detect capacitance variations of a plurality of target capacitors, the number of which is equal to that of the dual frequency generation units 110. When a plurality of dual frequency generation units 110 are installed therein, a plurality of DFM units 200 for controlling the plurality of dual frequency generation units 110, a plurality of enable signal input/output units 220, and a plurality of initial detection signal generation units 210 are also installed therein, which correspond to the plurality of dual frequency generation units 110, respectively. A single chip can prevent fa from simultaneous generation as a plurality of enable signal input/output units 220 are communicated to one and another.

[Second Embodiment of the Present Invention]

Figure 10:
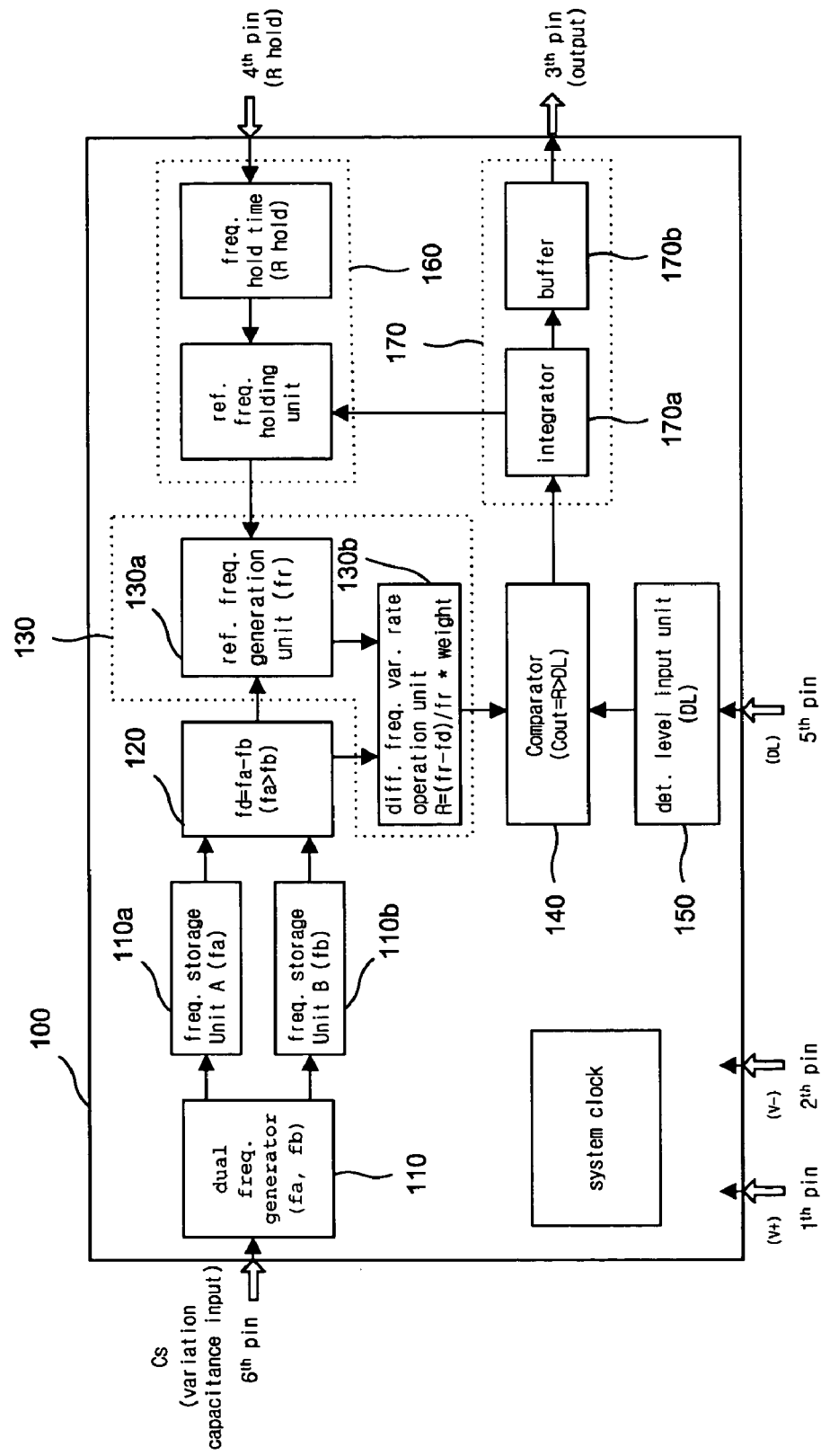
FIG. 10 is a schematic block diagram describing an IC for detecting capacitance variation according to a second embodiment of the present invention.

FIG. 10 is a schematic block diagram describing an IC 100 for detecting capacitance variation according to a second embodiment of the present invention, in which the IC has six pins. The second embodiment of the present invention is the same as that of the first embodiment of the present invention except that the $4^{th}$ pin is employed to input a frequency holing input lead. Of course the second embodiment of the present invention can be implemented as an additional pin for inputting a frequency holding input, such as a $7^{th}$ pin, is further installed into the first embodiment of the present invention without removing its $4^{th}$ pin. As such, when the $4^{th}$ pin is used for inputting a frequency holing input, the speed at which the reference frequency fr follows the difference frequency can be desirably selected therethrough.

As apparent from the above description, since the present invention detects capacitance variation of a target capacitor using two time divisional frequencies, as opposed to a single frequency, it is not affected by time delay component of a charging/discharging control unit, thereby enhancing sensitivity of capacitance variation. Also, since a plurality of detection levels can be inputted through a single external pin, the IC chip of the present invention can be reduced in size.

Occurrence period of frequency fa consuming relatively much power intensively increases at a time point when capacitance variation varies in the DFM unit 200 and decreases a time period when capacitance is nearly varied, thereby reducing power consumption of circuit operations. Also, occurrence period of fa of a plurality of chips electrically connected to a plurality of enable signal input/output leads are not overlapped. Especially, when severe noise is present, interference among chips can be reduced. Also, when a signal having a high interval is applied to the enable signal input/output lead through an external microcomputer etc., the chip is operated only at the high interval. Therefore, since the chip is operated only during a desired period, current consumption can be optimized.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for detecting capacitance variation comprising the steps of:
   generating a detection frequency for capacitance variation and a detection frequency which lags the detection frequency by k times, wherein the detection frequencies are based on a time divisional format;
   using the detection frequencies to produce a difference frequency;
   obtaining variation rate of the difference frequency; and
   comparing the variation rate of the difference frequency with a predetermined detection level, and outputting a signal indicative of capacitance variation if the variation rate of the difference frequency is greater than the detection level.

2. The method as set forth in claim 1, wherein obtaining the operating variation rate of the difference frequency includes:
   generating reference frequencies (fr(t)) expressed by the following equations, $fr(t)=fr(t-1)+m-n$, if $fd(t)-fd(t-1)>m$;

$fr(t)=fr(t-1)+g$, if $0 \leq fd(t)-fd(t-1) \leq m$; and $fr(t)=fr(t-1)+h$, if $fd(t)-fd(t-1)<0$, wherein, t and t−1 denote a current period and a previous period, respectively, $m \geq 1$, $0<n<m$, $g \geq 1$, $h \geq 1$, and $g>h$; and
   obtaining the variation rate of the difference frequency by using $(fr(t)-fd(t))/fr(t)$.

3. An integrated circuit for detecting capacitance variation comprising:
   a dual frequency generation unit for generating a detection frequency for capacitance variation of a target capacitor and a detection frequency which lags the detection frequency by k times, wherein the detection frequencies are based on a time divisional format;
   a difference frequency operation unit for using the detection frequencies to produce a difference frequency;
   a difference frequency variation rate operation unit for obtaining variation rate of the difference frequency;
   a detection level input unit for inputting a predetermined detection level;
   a comparator for comparing the detection level inputted to the detection level input unit with the variation rate of the difference frequency; and
   an output unit for inverting its high level to low level if the variation rate of the difference frequency is greater than the detection level in the comparator, and outputting the low signal.

4. The integrated circuit as set forth in claim 3, wherein the difference frequency variation rate unit includes:
   a reference frequency generation unit for generating reference frequencies (fr(t)) expressed by the following equations, $fr(t)=fr(t-1)+m-n$, if $fd(t)-fd(t-1)>m$;

$fr(t)=fr(t-1)+g$, if $0 \leq fd(t)-fd(t-1) \leq m$; and $fr(t)=fr(t-1)+h$, if $fd(t)-fd(t-1)<0$, wherein, t and t−1 denote a current period and a previous period, respectively, $m \geq 1$, $0<n<m$, $g \geq 1$, $h \geq 1$, and $g>h$; and
   an operation unit for obtaining the variation rate of the difference frequency by using $(fr(t)-fd(t))/fr(t)$.

5. The integrated circuit as set forth in claim 4, further comprising:
   a reference frequency holding unit for holding a reference frequency (fr(t)) depending on time, which is generated in the reference generation unit.

6. The integrated circuit as set forth in claim 5, wherein the reference frequency holding unit includes a resistor such that a holding time of the reference frequency (fr(t)) is determined according to resistance of the resistor.

7. An integrated circuit chip including the IC as set forth in claim 5, comprising:
   an input lead for a voltage V+;
   an input lead for a voltage V−;
   an output lead;
   an input lead for a frequency holding time;
   an input lead for a detection level; and
   an input lead for capacitance.

8. The integrated circuit as set forth in claim 3, wherein the output unit includes an integrator for integrating the comparison result outputted form the comparator.

9. The integrated circuit as set forth in claim 3, wherein the detection level input unit includes a single external pin to which an internal reference clock, a current source and an external capacitor, such that the external capacitor can be charged by the current source;

wherein the detection level input unit measures time when a voltage of the external capacitor reaches the predetermined reference voltage and selects a detection level according to codes determined therein based on the measured time, thereby inputting a plurality of detection levels through the single pin.

10. The integrated circuit as set forth in claim 3, further comprising:

a dual frequency modulation unit enabling the dual frequency generation unit to increase occurrence period of the detection frequency during a predetermined time at a time point when the variation rate of the difference frequency is greater or less than the detection level.

11. The integrated circuit as set forth in claim 10, further comprising:

an enable signal input/output unit configured to be in a enable state if inputting a high voltage from the outside and to be in a standby state if inputting a low voltage, wherein the enable signal input/output unit generates a low signal in itself not to input the low signal from the outside and outputs the low signal to the outside so as to communicate with adjacent elements during the operation of the DFM.

12. The integrated circuit as set forth in claim 11, wherein the dual frequency generation unit is numerously configured to generate detection frequencies for a plurality of target capacitors, and wherein the enable signal input/output unit the number of which is identical to that of the dual frequency generation unit is installed thereto.

13. An integrated circuit chip including the integrated circuit as set forth in claim 10, comprising:

an input lead for a voltage V+;
an input lead for a voltage V−;
an output lead;
an input/output lead for inputting/outputting an enable signal;
an input lead for a detection level; and
an input lead for capacitance.

14. The integrated circuit as set forth in claim 3, wherein the target capacitor is connected in series or in parallel to a sensitivity adjusting capacitor, and to the dual frequency generation unit.

* * * * *